US 9,972,377 B2

(12) United States Patent
Oh et al.

(10) Patent No.: US 9,972,377 B2
(45) Date of Patent: May 15, 2018

(54) REFRESH CONTROLLER AND MEMORY DEVICE INCLUDING THE SAME

(71) Applicant: Samsung Electronics Co., Ltd., Suwon-si (KR)

(72) Inventors: Jong-Min Oh, Seoul (KR); Ho-Young Song, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 14 days.

(21) Appl. No.: 15/262,183

(22) Filed: Sep. 12, 2016

(65) Prior Publication Data

US 2017/0186481 A1   Jun. 29, 2017

(30) Foreign Application Priority Data

Dec. 28, 2015 (KR) .................. 10-2015-0187076

(51) Int. Cl.
G11C 11/406 (2006.01)
G11C 11/408 (2006.01)
G11C 11/4076 (2006.01)

(52) U.S. Cl.
CPC ...... *G11C 11/40615* (2013.01); *G11C 11/406* (2013.01)

(58) Field of Classification Search
CPC .................................................. G11C 11/406
USPC ............................................... 365/149
See application file for complete search history.

(56) References Cited

U.S. PATENT DOCUMENTS

| 4,317,169 | A | * | 2/1982 | Panepinto, Jr. | ....... G11C 11/406 711/106 |
| 4,387,423 | A | * | 6/1983 | King | ............... G11C 11/406 714/34 |
| 4,691,303 | A | * | 9/1987 | Churchward | ......... G11C 11/406 365/195 |
| 6,167,484 | A | * | 12/2000 | Boyer | ............... G11C 7/24 365/222 |
| 9,032,141 | B2 | | 5/2015 | Bains et al. | |
| 9,236,110 | B2 | | 1/2016 | Bains et al. | |

(Continued)

FOREIGN PATENT DOCUMENTS

| KR | 10-2015-0002783 | 1/2015 |
| KR | 10-2015-0058366 | 5/2015 |
| KR | 10-2015-0065808 | 6/2015 |

*Primary Examiner* — Anthan Tran
*Assistant Examiner* — Mushfique Siddique
(74) *Attorney, Agent, or Firm* — Muir Patent Law, PLLC

(57) ABSTRACT

A refresh controller of a memory device may include a timing controller, a refresh counter and an address generator. The timing controller generates a counter refresh signal in response to receiving a refresh command provided from an external device, and generates a hammer refresh signal that is activated periodically. The refresh counter generates a counter refresh address signal in response to the counter refresh signal, such that the counter refresh address signal represents a row address, the refresh counter being configured sequentially change the counter refresh address signal. The address generator generates a hammer refresh address signal in response to the hammer refresh signal, the hammer refresh address signal representing an address of a row of the memory device that is physically adjacent to a row of the memory device corresponding to a hammer address that is accessed intensively.

17 Claims, 17 Drawing Sheets

(56) References Cited

U.S. PATENT DOCUMENTS

| | | |
|---|---|---|
| 9,286,964 B2 | 3/2016 | Halbert et al. |
| 2003/0231540 A1* | 12/2003 | Lazar .................... G11C 11/406 |
| | | 365/222 |
| 2006/0092741 A1* | 5/2006 | Kim ...................... G11C 7/1045 |
| | | 365/222 |
| 2013/0268727 A1 | 10/2013 | Sohn et al. |
| 2013/0326162 A1 | 12/2013 | Moon et al. |
| 2014/0095780 A1 | 4/2014 | Bains et al. |
| 2014/0177370 A1 | 6/2014 | Halbert et al. |
| 2014/0369109 A1* | 12/2014 | Lee ....................... G11C 11/406 |
| | | 365/149 |
| 2015/0016203 A1 | 1/2015 | Sriramagiri et al. |
| 2015/0043292 A1* | 2/2015 | Lee ...................... G11C 29/025 |
| | | 365/201 |
| 2015/0058549 A1 | 2/2015 | Jeffrey et al. |
| 2015/0085564 A1* | 3/2015 | Yoon ................. G11C 11/40611 |
| | | 365/149 |
| 2015/0109871 A1 | 4/2015 | Bains et al. |
| 2015/0162071 A1 | 6/2015 | Yoon et al. |
| 2015/0170728 A1* | 6/2015 | Jung ........................ G11C 8/08 |
| | | 365/222 |
| 2015/0235694 A1* | 8/2015 | Kim ................. G11C 11/40626 |
| | | 365/222 |
| 2015/0255140 A1* | 9/2015 | Song .................... G11C 11/406 |
| | | 365/222 |
| 2017/0011792 A1* | 1/2017 | Oh .................... G11C 11/40622 |

* cited by examiner

REFRESH CONTROLLER AND MEMORY DEVICE INCLUDING THE SAME

CROSS-REFERENCE TO RELATED APPLICATION

This U.S. Non-provisional application claims priority under 35 USC § 119 to Korean Patent Application No. 10-2015-0187076, filed on Dec. 28, 2015, in the Korean Intellectual Property Office (KIPO), the disclosure of which is incorporated by reference in its entirety herein.

BACKGROUND

1. Technical Field

Example embodiments relate generally to semiconductor integrated circuits, and more particularly to a refresh controller and a memory device including the refresh controller.

2. Discussion of the Related Art

Semiconductor memory devices for storing data may be classified into volatile memory devices and non-volatile memory devices. Volatile memory devices, such as dynamic random access memory (DRAM) devices, may be configured to store data by charging or discharging capacitors in memory cells, and lose the stored data when power is off. Non-volatile memory devices, such as flash memory devices, may maintain stored data even when power is off. Volatile memory devices are typically widely used as main memories of various apparatuses, and non-volatile memory devices are typically widely used for storing program code and/or data in various electronic devices, such as computers, mobile devices, etc.

In volatile memory devices, cell charges stored in a memory cell may be lost by a leakage current. In addition, when a wordline is transitioned frequently between an active state and a precharged state (i.e., when the wordline has been accessed intensively or frequently), an affected memory cell connected to a wordline that is adjacent to the wordline frequently accessed may easily lose stored charges. Charges stored in a memory cell may be recharged before data is lost by leakage of cell charges. Such recharge of cell charges is referred to as a refresh operation, and a refresh operation may be performed repeatedly before cell charges are significantly lost.

SUMMARY

Some example embodiments may provide a refresh controller capable of efficiently performing a hammer refresh operation associated with a hammer address that is intensively or frequently accessed.

Some example embodiments may provide a memory device including a refresh controller capable of efficiently performing the hammer refresh operation.

Some example embodiments may provide a method of controlling refresh of a memory device capable of efficiently performing the hammer refresh operation.

According to example embodiments, a refresh controller of a memory device includes a timing controller, a refresh counter and an address generator. The timing controller generates a counter refresh signal in response to receiving a refresh command provided from outside the memory device, and generates a hammer refresh signal that is activated periodically. The refresh counter generates a counter refresh address signal in response to the counter refresh signal, such that the counter refresh address signal represents a row address, the refresh counter being configured sequentially change the counter refresh address signal. The address generator generates a hammer refresh address signal in response to the hammer refresh signal, the hammer refresh address signal representing an address of a row of the memory device that is physically adjacent to a row of the memory device corresponding to a hammer address that is accessed a number of times greater than a reference number during a predetermined time period. The refresh controller may perform a normal refresh operation for the row corresponding to the row address in response to the counter refresh signal. The refresh controller may perform a hammer refresh operation for the row that is physically adjacent to the row corresponding to the hammer address in response to the hammer refresh signal.

According to example embodiments, a memory device includes a memory cell array including a plurality of memory cells and a refresh controller configured to control a refresh operation of the memory cells. The refresh controller includes a timing controller configured to generate a counter refresh signal in response to reception timing of a refresh command provided from a memory controller and generate a hammer refresh signal that is activated periodically regardless of the reception timing of the refresh command, a refresh counter configured to generate a counter refresh address signal in response to the counter refresh signal such that the counter refresh address signal represents a row address of the memory device that is changing sequentially and an address generator configured to generate a hammer refresh address signal in response to the hammer refresh signal, the hammer refresh address signal representing an address of a row of the memory device that is physically adjacent to a row of the memory device corresponding to a hammer address that is accessed a number of times greater than a reference number during a predetermined time period.

According to example embodiments, a method of controlling a refresh operation in a memory device includes generating a counter refresh signal in response to reception timing of a refresh command provided from a memory controller, generating a hammer refresh signal that is activated periodically regardless of the reception timing of the refresh command, generating a counter refresh address signal in response to the counter refresh signal such that the counter refresh address signal represents a row address of the memory device that is changing sequentially and generating a hammer refresh address signal in response to the hammer refresh signal, the hammer refresh address signal representing an address of a row of the memory device that is physically adjacent to a row of the memory device corresponding to a hammer address that is accessed a number of times greater than a reference number during a predetermined time period.

According to example embodiments, a memory device includes a memory cell array including a plurality of memory cells arranged in rows and columns, and a refresh control circuit configured to generate a counter refresh signal in response to a refresh command received from outside the memory device, and configured to generate a hammer refresh signal in response to an internal refresh command, the hammer refresh signal and the internal refresh command being activated periodically. The refresh control circuit may perform a first refresh operation for rows of the memory cell array in response to the counter refresh signal, and in response to the hammer refresh signal, may perform a second refresh operation for a row of the memory cell array that is an adjacent row corresponding to a hammer address accessed a number of times greater than a reference number during a predetermined time period.

BRIEF DESCRIPTION OF THE DRAWINGS

Example embodiments of the present disclosure will be more clearly understood from the following detailed description taken in conjunction with the accompanying drawings.

DETAILED DESCRIPTION OF THE EMBODIMENTS

Figure 1:
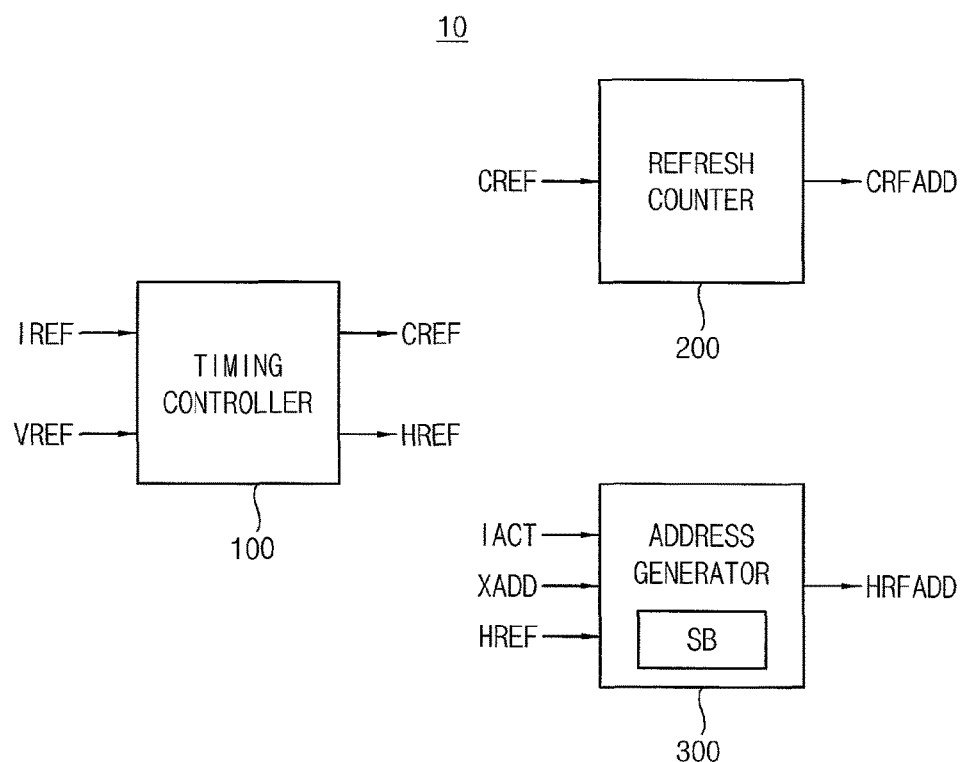
FIG. 1 is a block diagram illustrating a refresh controller according to example embodiments.

Various example embodiments will be described more fully hereinafter with reference to the accompanying drawings, in which some example embodiments are shown. The present disclosure may, however, be embodied in many different forms and should not be construed as limited to the example embodiments set forth herein. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. Unless the context indicates otherwise, these terms are only used to distinguish one element from another. Thus, a first element discussed below could be termed a second element without departing from the teachings of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

Figure 2:
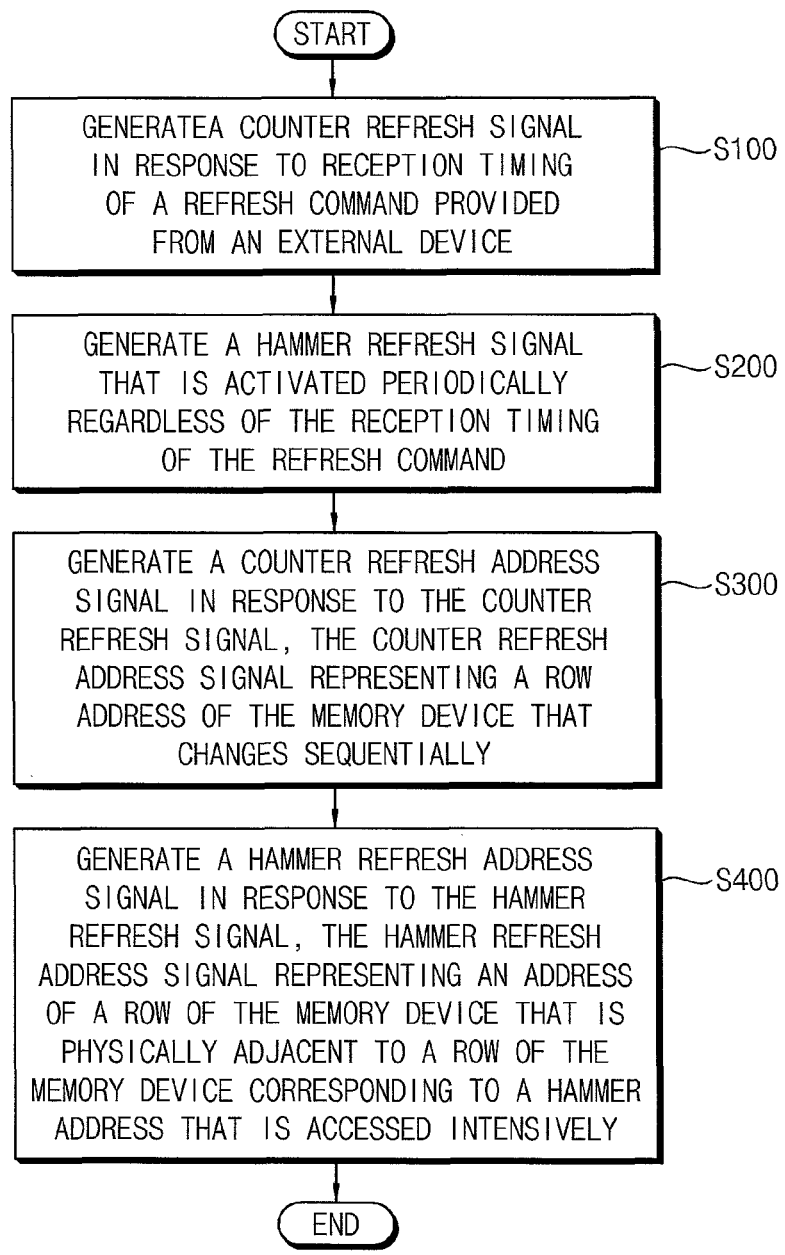
FIG. 2 is a flow chart illustrating a method of controlling a refresh operation for a memory device according to example embodiments.

FIG. 1 is a block diagram illustrating a refresh controller according to example embodiments, and FIG. 2 is a flow chart illustrating a method of controlling a refresh operation for a memory device according to example embodiments.

Referring to FIG. 1, a refresh controller 10 may include a timing controller 100, a refresh counter 200 and an address generator 300.

Referring to FIGS. 1 and 2, the timing controller 100 may generate a counter refresh signal CREF in response to a refresh command provided from an external device (e.g., a memory controller) (S100). For example, the counter refresh signal CREF may be generated in response to reception timing of the refresh command. In addition, the timing controller 100 may generate a hammer refresh signal HREF that is activated periodically regardless of the reception timing of the refresh command (S200). As will be described below with reference to FIG. 13, the timing controller 100 may receive an internal refresh signal IREF representing the reception timing of the refresh command. In example embodiments, the timing controller 100 may directly receive a refresh command EREF from a source outside the memory device (e.g., from a memory controller). The internal refresh signal IREF may be generated by the external refresh command EREF. The timing controller 100 may receive a virtual refresh signal VREF having a first cyclic period and activate the hammer refresh signal HREF having a second cyclic period based on the virtual refresh signal VREF, such that the second cyclic period is n times the first cyclic period where n is a positive integer, as will be described below with reference to FIGS. 2, 3 and 4. The virtual refresh signal VREF may be a refresh clock signal RFCK for a self-refresh operation and the first cyclic period may correspond to an average refresh interval time tREFi, as will be described below with reference to FIGS. 7 and 8. In example embodiments, virtual refresh signal VREF may be generated by a signal generator included in a memory device or may be provided from outside the memory device (e.g., a memory controller).

The refresh counter 200 may generate a counter refresh address signal CRFADD in response to the counter refresh signal CREF such that the counter refresh address signal CRFADD may represent a row address of the memory device that changes sequentially (S300). For example, the refresh counter 200 may increase a value of the counter refresh address signal CRFADD whenever the counter refresh signal CREF is activated. Wordlines of the memory cell array may be selected sequentially for refresh operations by increasing the value of the counter refresh address signal CRFADD. The memory device may perform a refresh operation (e.g., a normal refresh operation) for rows of the memory cell array in response to the counter refresh address signal CRFADD.

Figure 13:
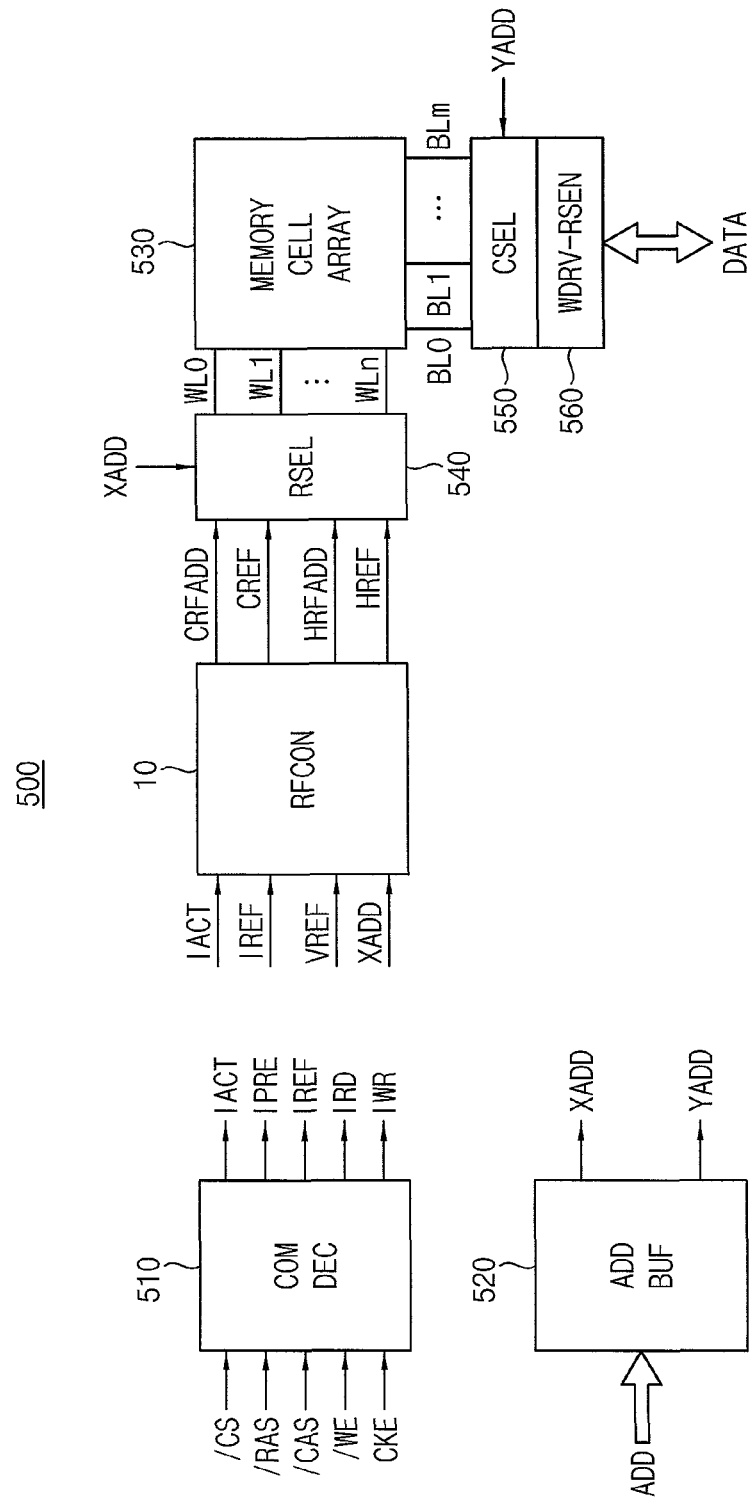
FIG. 13 is a block diagram illustrating a memory device including a refresh controller according to example embodiments.

The address generator 300 may generate a hammer refresh address signal HRFADD in response to the hammer refresh signal HREF such that the hammer refresh address signal HRFADD may represent an address of a row of the memory device that is physically adjacent to a row of the memory device corresponding to a hammer address that is accessed intensively (S400). Hereinafter, the hammer address may be an address of a memory location (e.g., memory row) that is accessed a number of times equal to or greater than a reference number (e.g., 100, 500, 1000, 2000, etc.) during a predetermined time period. In some example embodiments, the address generator 300 may include a storage block SB that is configured to store row addresses and respective access count values corresponding to the row addresses as the information with respect to the hammer address based on (e.g., in response to) an active signal IACT and an address signal XADD provided from the memory controller such that each of the access count values may indicate a number of occurrence of access to a respective row addresses during a predetermined time period. In certain embodiments, as shown in FIG. 13, the active signal IACT may be provided from a commander decoder and the address signal XADD may be provided from an address buffer. In some embodiments, the hammer refresh address signal HRFADD may correspond to an address of a row (e.g., a first row) that is physically directly adjacent to a row (e.g., a second row) identified by the hammer address. It will be understood that there may be no intervening rows between the second row corresponding to the hammer address and the first row that is physically directly adjacent to the second row corresponding to the hammer address. There may be more than one first row—e.g., one first row immediately adjacent the second row on a one side of the second row and another first row immediately adjacent to the second row on the other side of the second row.

The memory device may be performed a refresh operation (e.g., a hammer refresh operation) for a row of the memory cell array that is physically adjacent to a row identified by the hammer address in response to the hammer refresh address signal HRFADD.

The refresh controller 10 according to example embodiments may prevent loss of memory cell data and enhance performance of the memory device by periodically performing the hammer refresh operation associated with the intensively-accessed hammer address regardless of the refresh command from an external device.

Figure 3:
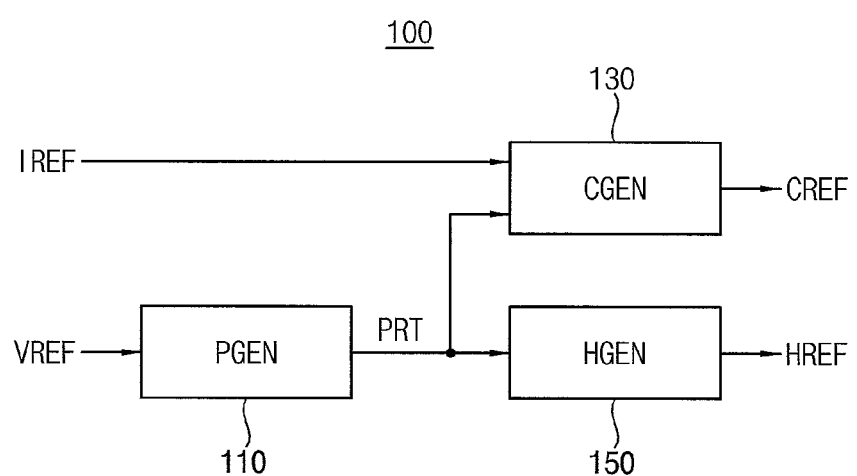
FIG. 3 is a block diagram illustrating an example embodiment of a timing controller included in the refresh controller of FIG. 1 according to example embodiments.
Figure 4:
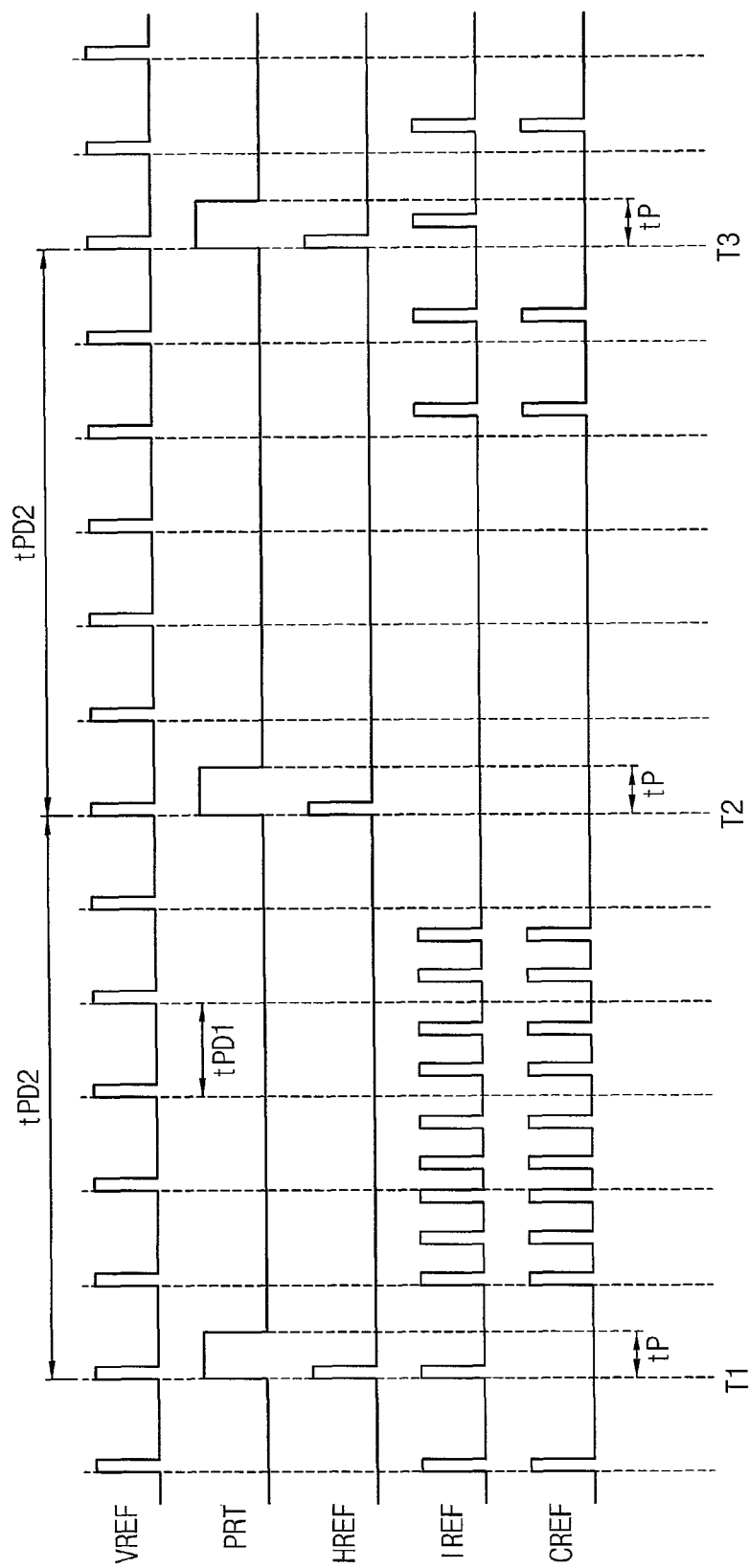
FIG. 4 is a timing diagram illustrating an example operation of the timing controller of FIG. 3 according to example embodiments.

FIG. 3 is a block diagram illustrating an example embodiment of a timing controller included in the refresh controller of FIG. 1 according to example embodiments, and FIG. 4 is a timing diagram illustrating an example operation of the timing controller of FIG. 3 according to example embodiments.

Referring to FIG. 3, a timing controller 100 may include a first signal generator PGEN 110, a second signal generator CGEN 130 and a third signal generator HGEN 150.

Referring to FIGS. 3 and 4, the first signal generator 110 may generate a hammer priority signal PRT based on a virtual refresh signal VREF having a first cyclic period tPD1. FIG. 4 illustrates an non-limiting example that the virtual refresh signal VREF include pulses per first cyclic period tPD1. For example, the first signal generator 110 may count the pulses of the virtual refresh signal VREF by a reference number to activate the hammer priority signal PRT periodically. As a result, the first signal generator 110 may activate the hammer priority signal PRT for an activation time tP by a second cyclic period tPD2 based on the virtual refresh signal VREF such that the second cyclic period tPD2 may be n times the first cyclic period tPD1 where n is a positive integer. For example, as illustrated in FIG. 4, the first signal generator 110 may activate the hammer priority signal PRT at time points T1, T2 and T3 corresponding every sixth pulse of the virtual refresh signal VREF. FIG. 4 illustrates an example that the reference number is six, that is, the second cyclic period tPD2 is six times the first cyclic period tPD1, but the reference number may be determined variously according to operational characteristics of the memory device.

The second signal generator 130 may generate the counter refresh signal CREF based on the hammer priority signal PRT and an internal refresh signal IREF representing the reception timing of the refresh command. The third signal generator 150 may generate the hammer refresh signal HREF based on the hammer priority signal PRT.

The timing controller 100 may activate the counter refresh signal CREF or the hammer refresh signal HREF selectively. For example, the timing controller 100 may prevent the simultaneous activation of the counter refresh signal CREF and the hammer refresh signal HREF. In this case, the simultaneous refresh for the two rows may be prevented and thus it is not required to consider the collision between the address represented by the counter refresh address signal CRFADD from the refresh counter 200 and the address represented by the hammer refresh address signal HRFADD from the address generator 300.

Using the hammer priority signal PRT, the timing controller 100 may activate the hammer refresh signal HREF instead of the counter refresh signal CREF while the hammer priority signal PRT is activated and activate the counter refresh signal CREF while the hammer priority signal PRT is not activated. For example, the timing controller 100 may deactivate the counter refresh signal CREF when activation timing of the hammer priority signal PRT overlaps with the reception timing of the refresh command and activate the counter refresh signal CREF in synchronization with the reception timing of the refresh command while the activation timing of the hammer priority signal PRT does not overlap with the reception timing of the refresh command.

The overlap of the activation timings of the hammer refresh signal HREF ant the reception timing of the refresh command may represent that the internal refresh signal IREF representing the reception timing of the refresh command is activated during the activation time tP of the hammer priority signal PRT. In FIG. 4, the activation timing of the hammer refresh signal HREF overlaps with the reception timing of the refresh command at time points T1 and T3.

The third signal generator 150 may activate the hammer refresh signal HREF whenever the hammer priority signal PRT is activated. In FIG. 4, the third signal generator 150 may activate the hammer refresh signal HREF in a form of pulses at time points T1, T2 and T3.

The second signal generator 130 may deactivate the counter refresh signal CREF regardless of the internal refresh signal IREF during the activation time tP of the hammer priority signal PRT. The second signal generator 130 may activate the counter refresh signal CREF in synchronization with the internal refresh signal IREF while the hammer priority signal PRT is deactivated. As such, the third signal generator 150 may use the hammer priority signal PRT as a mask signal or a blocking signal and deactivate the internal refresh signal IREF selectively based on the hammer priority signal PRT to generate the counter refresh signal CREF as illustrated in FIG. 4.

Figure 5:
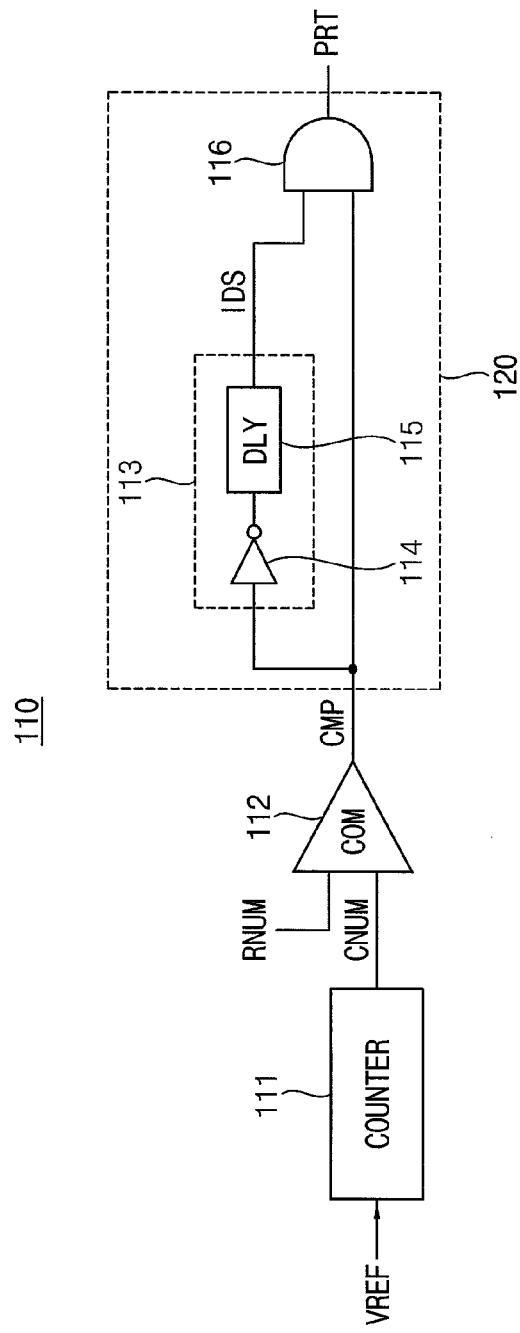
FIG. 5 is a diagram illustrating an example embodiment of a first signal generator included in the timing controller of FIG. 3 according to example embodiments.
Figure 6:
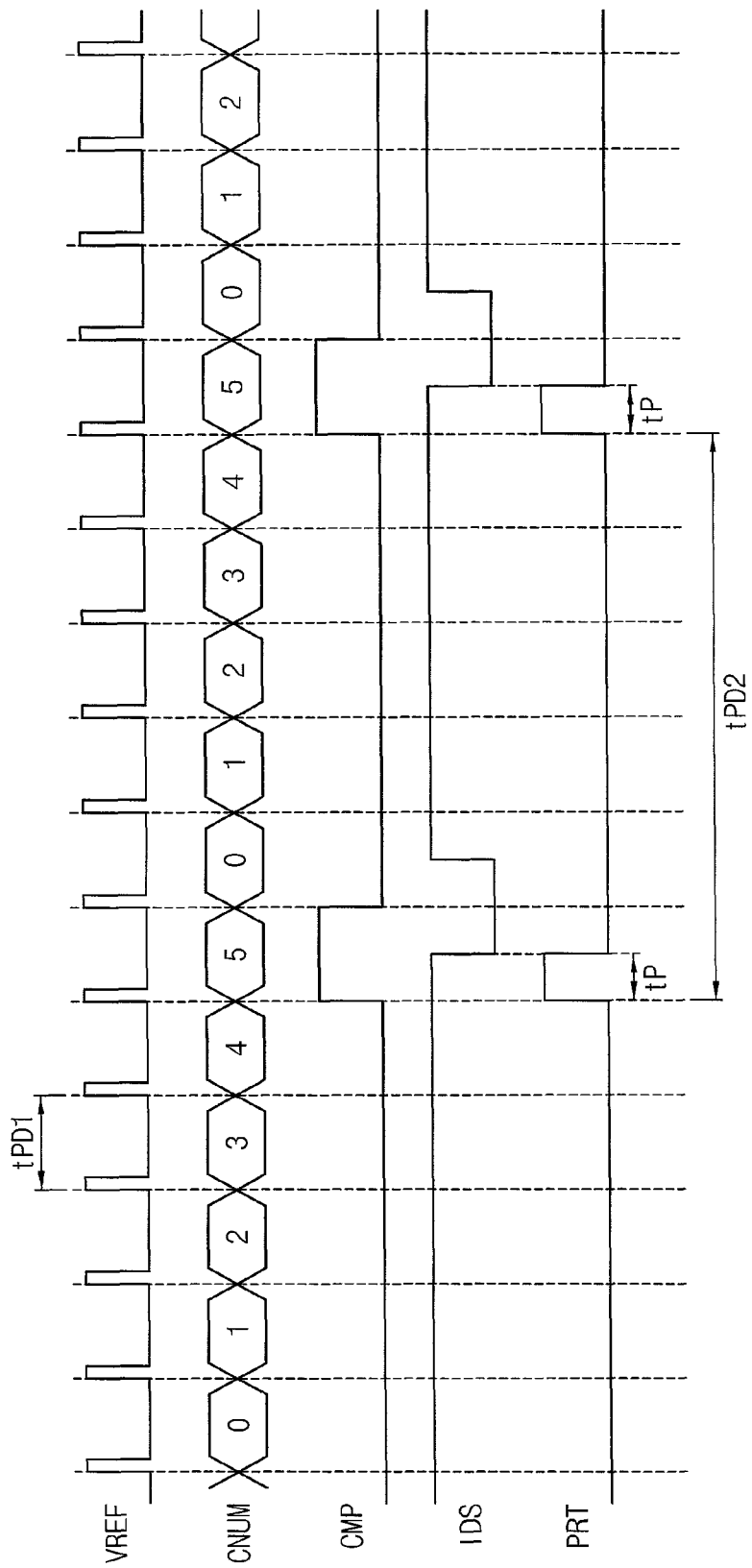
FIG. 6 is a timing diagram illustrating an example operation of the first signal generator FIG. 5 according to example embodiments.

FIG. 5 is a diagram illustrating an example embodiment of a first signal generator included in the timing controller of FIG. 3 according to example embodiments, and FIG. 6 is a timing diagram illustrating an example operation of the first signal generator FIG. 5 according to example embodiments.

Referring to FIG. 5, a first signal generator 110 may include a counter 111, a comparator COM 112 and a pulse generator 120. The pulse generator 120 may include an inversion-delay unit 113 and a logic gate 115. The inversion-delay unit 113 may include an inversion element 114 and a delay element DLY 115. For example, the inversion-delay unit 113 may be implemented with an odd-number of cascaded inverters where each inverter has a respective delay amount. As used herein, a "unit" is a "circuit."

Figure 8:
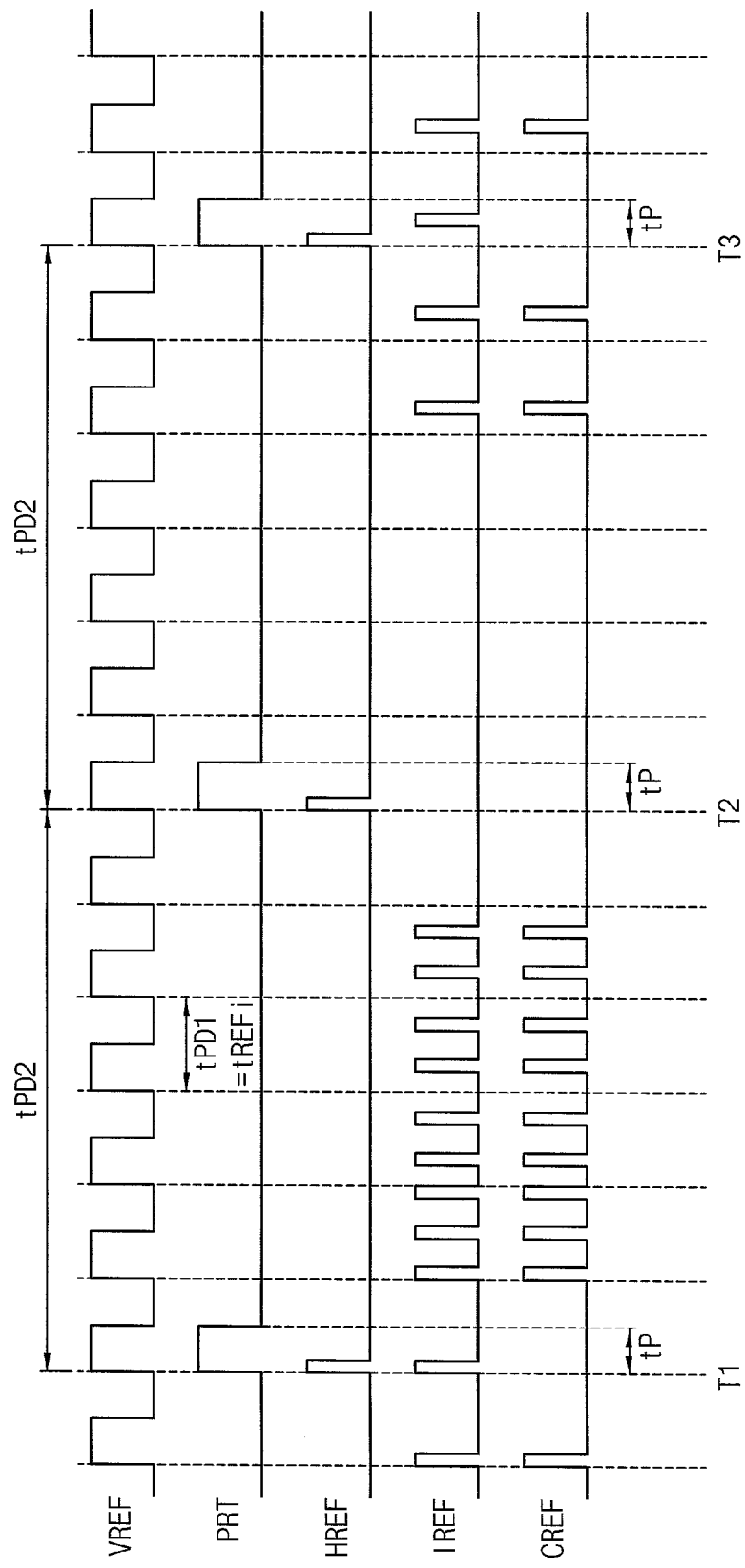
FIG. 8 is a timing diagram illustrating an example operation of the timing controller of FIG. 7 according to example embodiments.

Referring to FIGS. 5 and 6, the counter 111 may count the pulses of the virtual refresh signal VREF and provide a count number CNUM. The virtual refresh signal VREF may be a pulse signal as illustrated in FIG. 6 or a refresh clock signal RFCK as illustrated in FIG. 8. For example, the counter 111 may count the edges of the refresh clock signal RFCK to provide the count number CNUM. FIG. 6 illustrates an example that the count number CNUM is reset to zero when the count number CNUM reaches a reference number RNUM (e.g., five). In other example embodiments, the counter 111 may provide the count number CNUM increasing or decreasing continuously and a remainder after the count number CNUM is divided by the reference number RNUM may be provided to the comparator 112.

The comparator 112 may compare the count number CNUM with the reference number RNUM to generate a comparison signal CMP. The comparator 112 may activate the comparison signal CMP when the count number CNUM is equal to the reference number RNUM. The reference number RNUM may be determined depending on operational characteristics of the memory device and the reference number RNUM may be generated based on a value stored in, for example, a mode register set (not shown) of a memory device.

The pulse generator 120 may generate the hammer priority signal PRT based on the comparison signal CMP. The inversion-delay unit 113 of the pulse generator 120 may invert and delay the comparison signal CMP and generate an inversion-delay signal IDS. The logic gate 116 of the pulse generator 120 may perform a logic operation on the comparison signal CMP and the inversion-delay signal IDS to generate the hammer priority signal PRT.

As such, the hammer priority signal PRT may be generated based on the virtual refresh signal VREF having the first cyclic period tPD1. The hammer priority signal PRT may be activated for the predetermined activation time tP by the second cyclic period tPD2 based on the virtual refresh signal VREF such that the second cyclic period tPD2 may be n times the first cyclic period tPD1 where n is a positive integer. The activation time tP of the hammer priority signal PRT may be determined according to the delay amount of the inversion-delay unit 113. The configuration and the operation of the first signal generator 110 are not limited to those of FIGS. 5 and 6 and may be changed variously.

Figure 7:
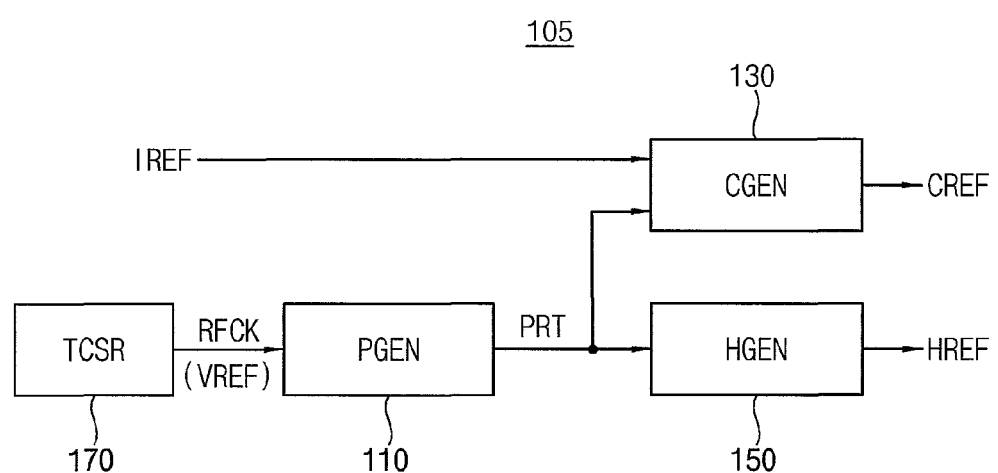
FIG. 7 is a block diagram illustrating an example embodiment of a timing controller included in the refresh controller of FIG. 1 according to example embodiments.

FIG. 7 is a block diagram illustrating an example embodiment of a timing controller included in the refresh controller of FIG. 1 according to example embodiments, and FIG. 8 is a timing diagram illustrating an example operation of the timing controller of FIG. 7 according to example embodiments.

Referring to FIG. 7, a timing controller 105 may include a first signal generator PGEN 110, a second signal generator CGEN 130, a third signal generator HGEN 150 and a temperature compensate self-refresh (TCSR) unit 170.

Referring to FIGS. 7 and 8, the TCSR unit 170 may generate a refresh clock signal RFCK having a first cyclic period tPD1. The refresh clock signal RFCK may be a clock signal for a self-refresh operation and the first cyclic period tPD1 may correspond to an average refresh interval time tREFi. The average refresh interval time tREFi may represent an average time between consecutive two refresh operations of the two rows in the same memory bank. For example, the average refresh interval time tREFi may be 7.8 µs (microsecond) and a refresh cycle time tRFC for the refresh operation of each row may be 350 ns (nanosecond) in case of 8 Gb DDR4 (double data rate 4) DRAM (dynamic random access memory). In this case, the memory controller may issue the refresh command per 7.8 µs and wait for 350 ns after issuing each refresh command to access the memory device. In some example embodiments, the average refresh interval time tREFi may be varied depending on the operational temperature of the memory device. The average refresh interval time tREFi may be decreased as the operational temperature of the memory device is increased.

The first signal generator 110 may generate a hammer priority signal PRT based on the refresh clock signal RFCK having the first cyclic period tPD1. The first signal generator 110 may count the pulses of the refresh clock signal RFCK by a reference number to activate the hammer priority signal PRT periodically. As a result, the first signal generator 110 may activate the hammer priority signal PRT for an activation time tP by a second cyclic period tPD2 based on the refresh clock signal RFCK such that the second cyclic period tPD2 may be n times the first cyclic period tPD1 where n is a positive integer. For example, as illustrated in FIG. 8, the first signal generator 110 may activate the hammer priority signal PRT at time points T1, T2 and T3 corresponding every sixth pulse of the refresh clock signal RFCK. FIG. 8 illustrates an example that the reference number is six, that is, the second cyclic period tPD2 is six times the first cyclic period tPD1, but the reference number may be determined variously according to operational characteristics of the memory device.

The second signal generator 130 may generate the counter refresh signal CREF based on the hammer priority signal PRT and an internal refresh signal IREF representing the reception timing of the refresh command. The third signal generator 150 may generate the hammer refresh signal HREF based on the hammer priority signal PRT.

The timing controller 105 may activate the counter refresh signal CREF or the hammer refresh signal HREF selectively. For example, the timing controller 105 may prevent the simultaneous activation of the counter refresh signal CREF and the hammer refresh signal HREF. In this case, the simultaneous refresh for the two rows may be prevented and thus it is not required to consider the collision between the address represented by the counter refresh address signal CRFADD from the refresh counter 200 and the address represented by the hammer refresh address signal HRFADD from the address generator 300.

Using the hammer priority signal PRT, the timing controller 105 may activate the hammer refresh signal HREF instead of the counter refresh signal CREF while the hammer priority signal PRT is activated and activate the counter refresh signal CREF while the hammer priority signal PRT is not activated. For example, the timing controller 105 may deactivate the counter refresh signal CREF when activation timing of the hammer priority signal PRT overlaps with the reception timing of the refresh command and activate the counter refresh signal CREF in synchronization with the reception timing of the refresh command while the activation timing of the hammer priority signal PRT does not overlap with the reception timing of the refresh command.

The overlap of the activation timings of the hammer refresh signal HREF and the reception timing of the refresh command may represent that the internal refresh signal IREF representing the reception timing of the refresh command is activated during the activation time tP of the hammer priority signal PRT. In FIG. 8, the activation timing of the hammer refresh signal HREF overlaps with the reception timing of the refresh command at time points T1 and T3.

The third signal generator 150 may activate the hammer refresh signal HREF whenever the hammer priority signal PRT is activated. In FIG. 8, the third signal generator 150 may activate the hammer refresh signal HREF in a form of pulses at time points T1, T2 and T3.

The second signal generator 130 may deactivate the counter refresh signal CREF regardless of the internal refresh signal IREF during the activation time tP of the hammer priority signal PRT. The second signal generator 130 may activate the counter refresh signal CREF in synchronization with the internal refresh signal IREF while the hammer priority signal PRT is deactivated. As such, the third signal generator 150 may use the hammer priority signal PRT as a mask signal or a blocking signal and deactivate the internal refresh signal IREF selectively based on the hammer priority signal PRT to generate the counter refresh signal CREF as illustrated in FIG. 8.

Figure 9:
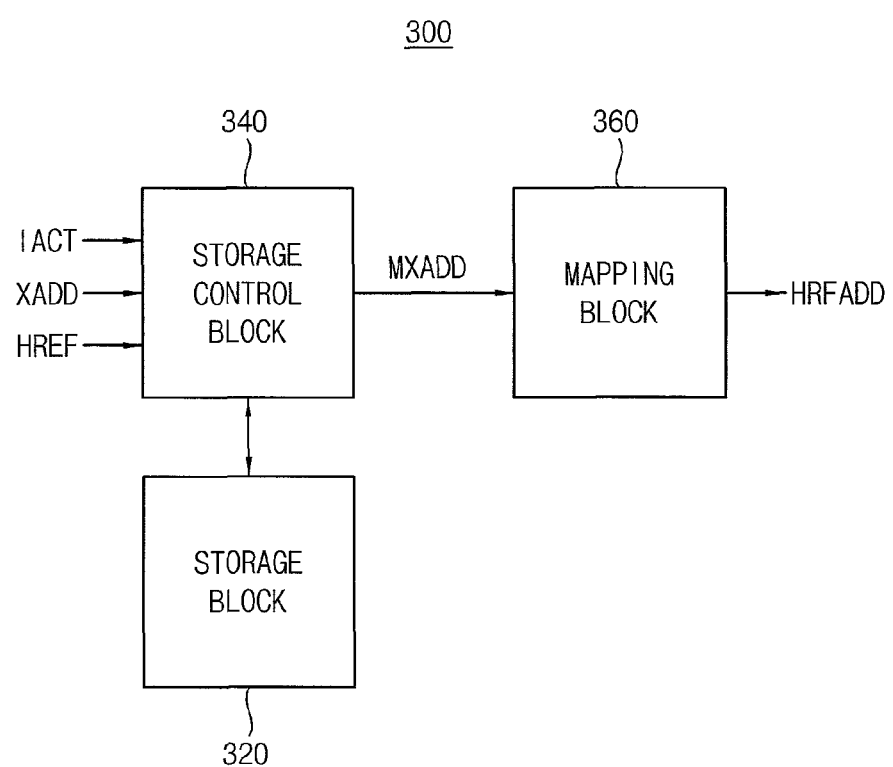
FIG. 9 is a block diagram illustrating an example embodiment of an address generator included in the refresh controller of FIG. 1 according to example embodiments.
Figure 10:
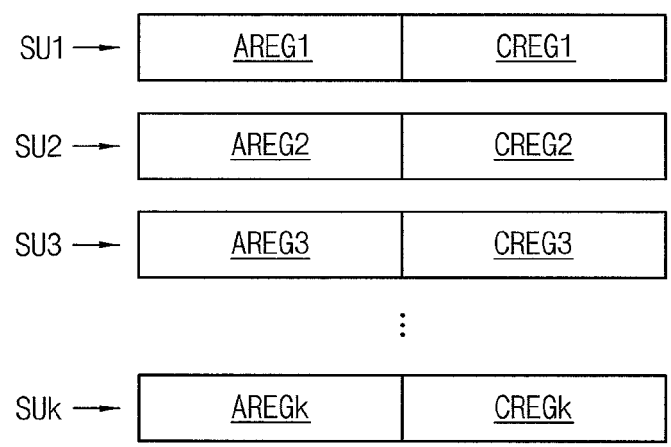
FIG. 10 is a diagram illustrating an example embodiment of a storage block included in the address generator of FIG. 9 according to example embodiments.

FIG. 9 is a block diagram illustrating an example embodiment of an address generator included in the refresh controller of FIG. 1 according to example embodiments, and FIG. 10 is a diagram illustrating an example embodiment of a storage block included in the address generator of FIG. 9 according to example embodiments.

Referring to FIG. 9, an address generator 300 may include a storage block 320, a storage control block 340 and a mapping block 360.

The storage block 320 may store the information with respect to the hammer address MXADD. In some example embodiments, the storage block 320 may include a plurality of storage units SU1~SUk as illustrated in FIG. 10. The storage units SU1~SUk may include address registers AREG1~AREGk storing the row addresses that are accessed and count registers CREG1~CREGk storing access count values corresponding to the row addresses.

The storage control block 340 may control the storage block 320 based on the hammer refresh signal HREF, the active signal IACT and the address signal XADD provided from the memory controller. Also the storage control block 340 may provide the hammer address MXADD based on the information stored in the storage block 320.

Figure 14:
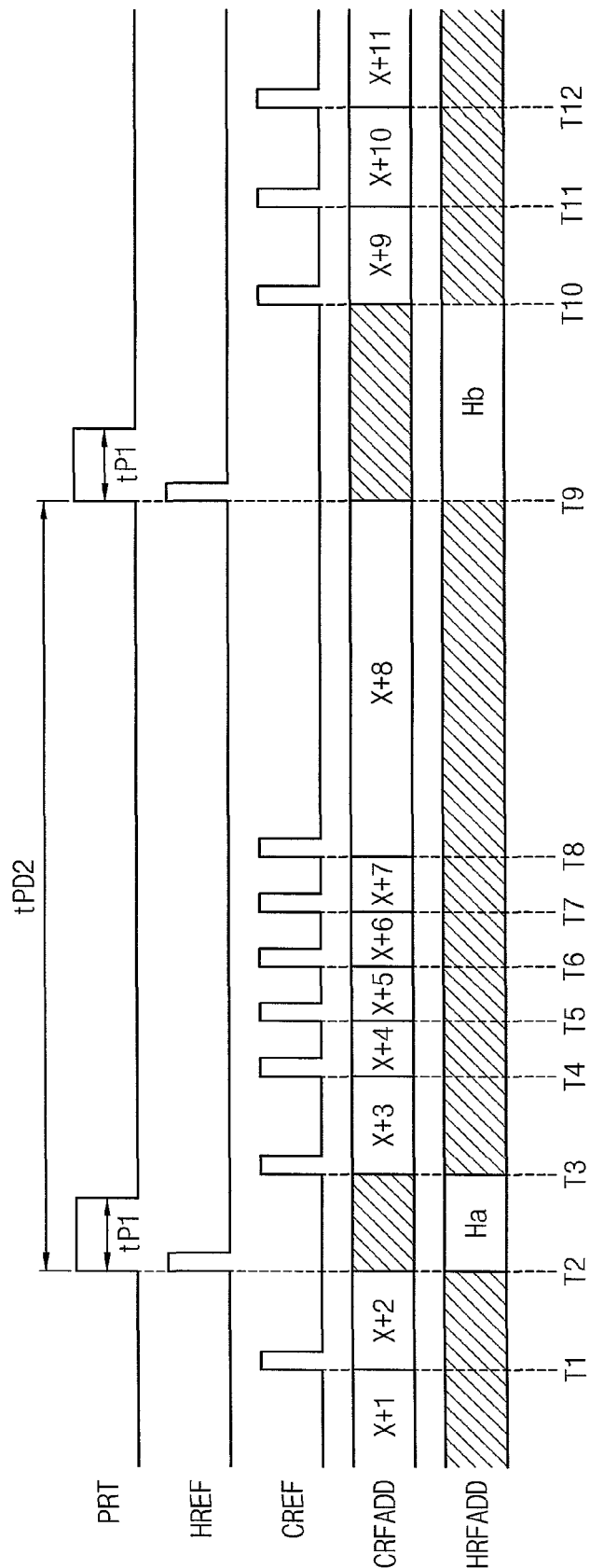
FIGS. 14 and 15 are diagrams illustrating example operations of a refresh controller according to example embodiments.
Figure 15:
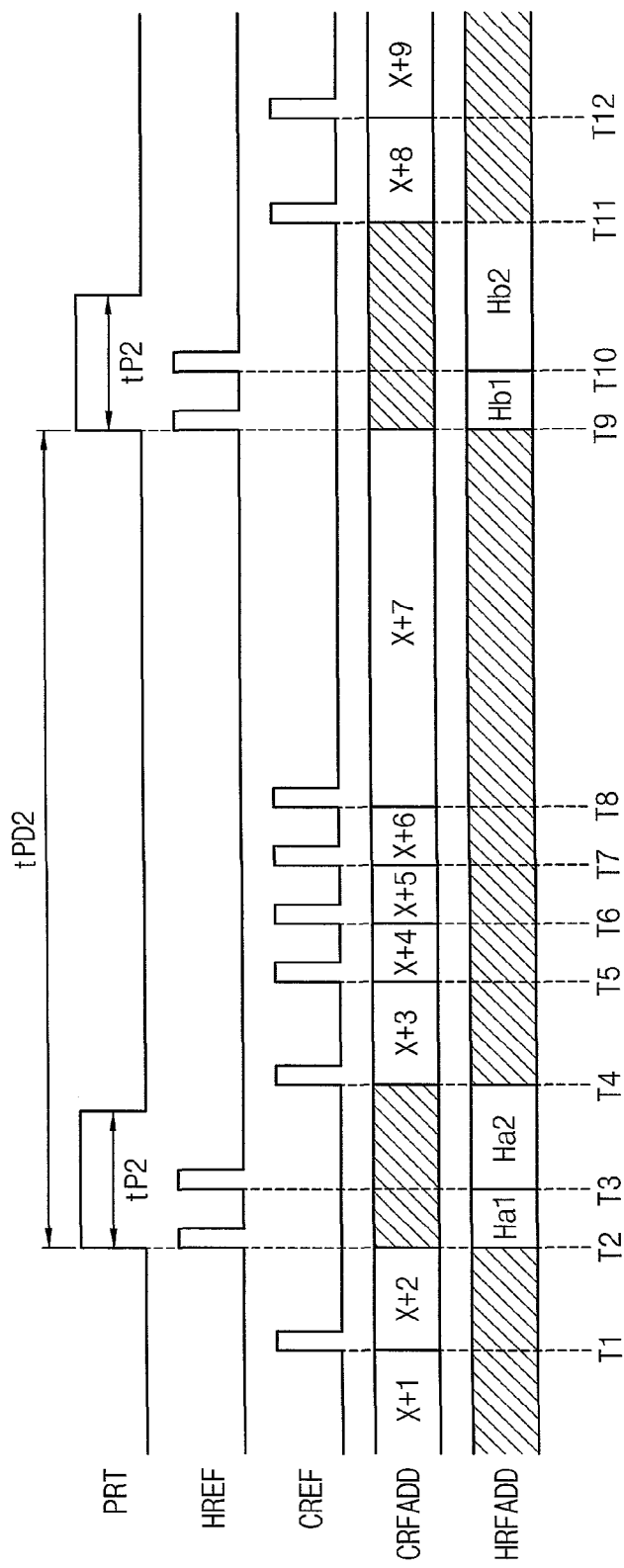

The mapping block 360 may generate the hammer refresh address signal HRFADD based on the hammer address MXADD. As will be described below with reference to FIG. 11, the hammer refresh address signal HRFADD may correspond to an address of a row that is physically adjacent to (e.g., physically directly adjacent to) a row corresponding to the hammer address MXADD. In some example embodiments, as illustrated in FIG. 14, the mapping block 360 may provide an address of one row of two adjacent rows, in response to activation of the hammer refresh signal HREF. In some example embodiments, as illustrated in FIG. 15, the mapping block 360 may sequentially provide addresses corresponding to two adjacent rows (e.g., two directly adjacent rows) while the priority signal PRT is activated in response to activation of the hammer refresh signal HREF.

Figure 11:
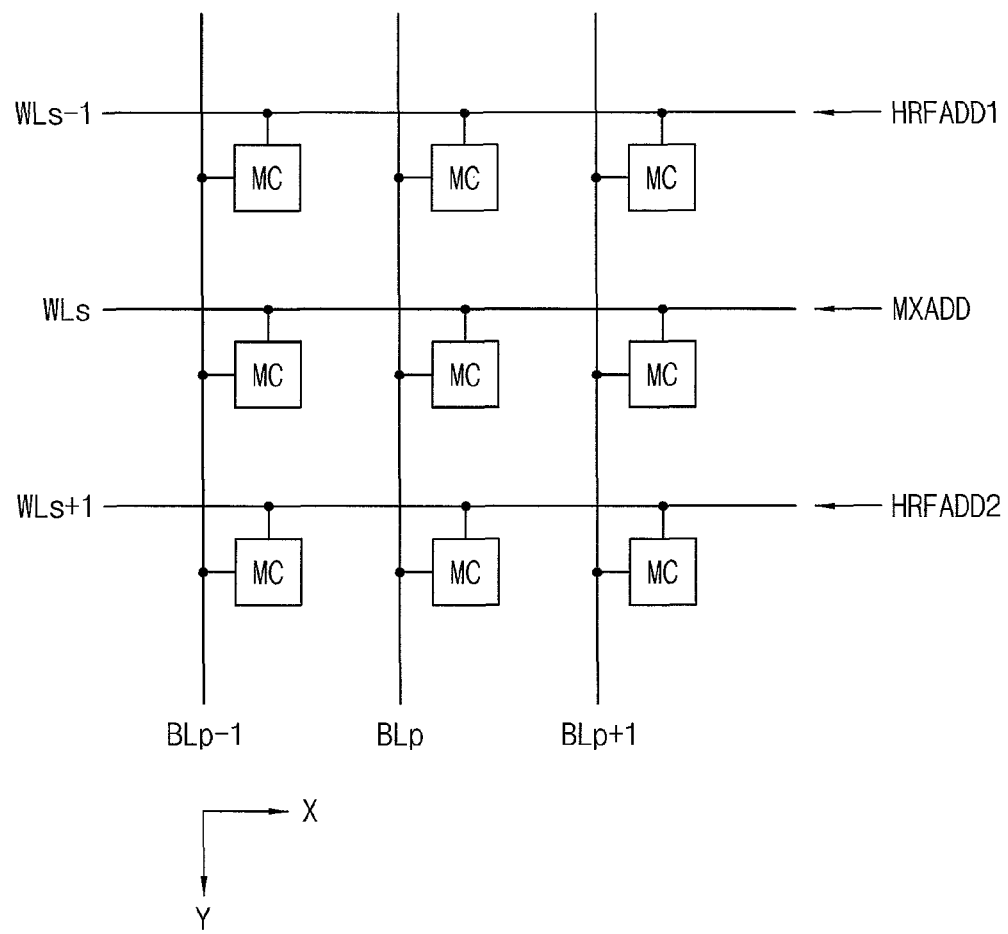
FIG. 11 is a diagram illustrating a portion of a memory cell array for describing a data loss due to wordline coupling.

FIG. 11 is a diagram illustrating a portion of a memory cell array for describing a data loss due to wordline coupling.

FIG. 11 illustrates three wordlines WLs−1, WLs and WLs+1, three bitlines BLp−1, BLp and BLp+1 and memory cells MC coupled to the wordlines WLs−1, WLs and WLs+1 and the bitlines BLp−1, BLp and BLp+1 in the memory cell array. The three wordlines WLs−1, WLs and WLs+1 are extended in a row direction (i.e., X direction) and arranged sequentially along a column direction (i.e., Y direction). The three bitlines BLp−1, BLp and BLp+1 are extended in the column direction and arranged sequentially along the row direction. It will be understood that the wordlines WLs−1 and WLs are physically directly adjacent to each other since there are no intervening wordlines between the wordlines WLs−1 and WLs.

For example, the middle wordline WLs may correspond to the hammer address MXADD that has been accessed intensively. It will be understood that "an intensively-accessed wordline" refers to a wordline that has a relatively higher activation number and/or has a relatively higher activation frequency. For example, the number of times that the middle wordline WLs has been activated may be greater than the number of times that other wordlines WLs−1 and WLs+1 have been activated and/or the middle wordline WLs has been activated at a frequency higher than that of other wordlines WLs−1 and WLs+1. For another example, the number of times that the middle wordline WLs has been activated (e.g., accessed) may be equal to or greater than a reference number (e.g., 100, 500, 1000, 2000, etc.) during a predetermined time period. Thus, the wordline WLs may be indicated as a hammer wordline and a row address of the hammer wordline WLs may be indicated as a hammer address. Whenever the hammer wordline (e.g., the middle wordline WLs) is accessed, the hammer wordline WLs is enabled and precharged, then the voltage level of the hammer wordline WLs is increased and decreased. Wordline coupling may cause the voltage levels of the adjacent wordlines WLs−1 and WLs+1 to fluctuate as the voltage level of the hammer wordline WLs varies, and thus the cell charges of the memory cells MC coupled to the adjacent wordlines WLs−1 and WLs+1 are affected. As the hammer wordline WLs is accessed more frequently, the cell charges of the memory cells MC coupled to the adjacent wordlines WLs−1 and WLs+1 may be lost more easily.

The address generator 300 may provide the hammer refresh address signal HRFADD representing the addresses HRFADD1 and HRFADD2 of the rows (e.g., the wordlines WLs−1 and WLs+1) that are physically adjacent to the row of the hammer address MXADD (e.g., the middle wordline WLs), and an refresh operation for the adjacent wordlines WLs−1 and WLs+1 may be performed additionally based on the hammer refresh address signal HRFADD to reduce or possibly prevent the loss of data stored in the memory cells MC connected to the wordlines WLs−1 and WLs+1.

Figure 12:
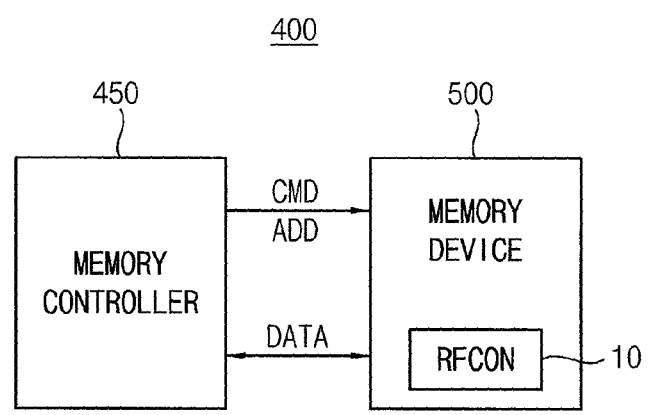
FIG. 12 is a block diagram illustrating a memory system including a refresh controller according to example embodiments.

FIG. 12 is a block diagram illustrating a memory system including a refresh controller according to example embodiments, and FIG. 13 is a block diagram illustrating a memory device including a refresh controller according to example embodiments.

Referring to FIG. 12, a memory system 400 may include a memory controller 450 and a memory device 500. Referring to FIG. 13, the memory device 500 may include a command decoder COM DEC 510, an address buffer ADD BUF 520, a memory cell array 530, a row selection circuit RSEL 540, a column selection circuit CSEL 550, an input-output circuit 560 and an embedded refresh controller RFCON 10. The input-output circuit 560 may include a write driver WDRV and a read sensing circuit RSEN.

The memory device 500 may include an interface for communicating with the memory controller 450. For example, the memory device 500 may include a DRAM interface. The DRAM interface may include control pads (or pins), address pads and data pads. The memory device 500 may receive a command CMD, that is, control signals such as a chip selection signal/CS, a row address strobe signal/RAS, a column address strobe signal /CAS, a write enable signal/WE, a clock enable signal CKE, etc. through the control pads. The memory device 500 may receive the address signal ADD through the address pads, and receive the write data or transmit the read data through the data pads.

The memory cell array 530 may include a plurality of memory cells respectively coupled to a plurality of wordlines WL0 through WLn and a plurality of bitlines BL0 through BLm. The memory cells may have a configuration that needs a refresh such as a DRAM cell.

The command decoder 510 may generate internal command signals such as an internal active signal IACT, an internal precharge signal IPRE, an internal refresh signal IREF, an internal read signal IRD, an internal write signal IWR, etc. based on the control signals /CS, /RAS, /CAS, /WE and CKE received from the memory controller 450 in FIG. 12.

As described above, the refresh controller 10 may receive the internal active signal IACT, the internal refresh signal IREF (or an external refresh command EREF), the virtual refresh signal VREF and the address signal XADD and may provide the counter refresh signal CREF, the hammer refresh signal HREF, the counter refresh address signal CRFADD and the hammer refresh address signal HRFADD for a refresh operation of a memory device.

The address buffer 520 may generate a row address signal XADD and a column address signal YADD based on an external address ADD transferred from the memory controller 450. The row address signal XADD may be provided to the row selection circuit 540 and the column address signal YADD may be provided to the column selection circuit 550. Even though not illustrated in FIG. 13, the memory cell array 530 may include a plurality of memory banks and the address buffer 520 may further provide a bank address signal.

The row selection circuit 540 may select a wordline corresponding to the row address signal XADD among the wordlines WL0 through WLn for a read operation or a write operation. Also the row selection circuit 540 may select a wordline corresponding to the counter refresh address signal CRFADD or the hammer refresh address signal HRFADD among the wordlines WL0 through WLn for a refresh operation. The row selection circuit 540 may select a wordline corresponding to the counter refresh address signal CRFADD when the counter refresh signal CREF is activated, and the row selection circuit 530 may select a wordline corresponding to the hammer refresh address signal HRFADD when the hammer refresh signal HREF is activated. The column selection circuit 550 may select a bitline corresponding to the column address signal YADD among the bitlines BL0 through BLm.

The write driver WDRV and the read sensing circuit RSEN are coupled to the bitlines BL0 through BLm. The write driver WDRV and the read sensing circuit RSEN may be coupled to the bitlines BL0 through BLm directly or via the column selection circuit 550.

FIGS. 14 and 15 are diagrams illustrating example operations of a refresh controller according to example embodiments.

FIGS. 14 and 15 illustrate examples of generating the hammer priority signal PRT, the hammer refresh signal HREF, the counter refresh signal CREF, the counter refresh address signal CRFADD and the hammer refresh address signal HRFADD. Time points T1 through T12 represents activation time points of the hammer refresh signal HREF and the counter refresh signal CREF. According to example embodiments, the intervals between activation time points of the hammer refresh signal HREF may be regular as the second cyclic period tPD2. The intervals between the activation time points of the counter refresh signal CREF may be regular or irregular.

Referring to FIGS. 1, 3 and 14, the timing controller 100 may activate the hammer refresh signal HREF at time points T2 and T9 in synchronization with the hammer priority signal PRT and activate the counter refresh signal CREF at time points T1, T3~T8, T10~T12 in synchronization with the internal refresh signal IREF. As described above, the counter refresh signal CREF may be deactivated during the activation time tP1 of the hammer priority signal PRT even though the internal refresh signal IREF is activated. The refresh counter 200 may generate the counter refresh address signal CRFADD representing addresses X+1~X+11 that changes sequentially in synchronization with the activation time points T1, T3~T8 and T10~T12 of the counter refresh signal CREF. The address generator 300 may generate the hammer refresh address signal HRFADD in synchronization with the activation time points T2 and T9 such that the hammer refresh address signal HRFADD may represent the addresses Ha and Hb of rows of the memory device that are physically adjacent to a row of the memory device corresponding to the hammer address MXADD.

As illustrated in FIG. 14, the third signal generator 150 in the timing controller 100 may activate the hammer refresh signal HREF once whenever the hammer priority signal PRT is activated. The activation time tP1 of the hammer priority signal PRT may be set to be equal to or longer than the refresh cycle time tRFC required to refresh one row. The address generator 300 may provide one address of one row that is physically adjacent to the row corresponding to the hammer address through the hammer refresh address signal HRFADD whenever the hammer priority signal PRT is activated. For example, the address Ha may be smaller by one than the hammer address at time point T2 and the address Hb may be larger by one than the hammer address at time point T9. As such, the address smaller than the hammer address and the address larger than the hammer address may be provided alternatively whenever the hammer priority signal PRT is activated.

Referring to FIGS. 1, 3, and 15, the timing controller 100 may activate the hammer refresh signal HREF at time points T2, T3, T9 and T10 in synchronization with the hammer priority signal PRT and activate the counter refresh signal CREF at time points T1, T4~T8, T11 and T12 in synchronization with the internal refresh signal IREF. As described above, the counter refresh signal CREF may be deactivated during the activation time tP2 of the hammer priority signal PRT even though the internal refresh signal IREF is activated. The refresh counter 200 may generate the counter refresh address signal CRFADD representing addresses X+1~X+9 that changes sequentially in synchronization with the activation time points T1, T4~T8, T11 and T12 of the counter refresh signal CREF. The address generator 300 may generate the hammer refresh address signal HRFADD in synchronization with the activation time points T2, T3, T9 and T10 such that the hammer refresh address signal HRFADD may represent addresses Ha1, Ha2, Hb1 and Hb2 of rows of the memory device that are physically adjacent to a row of the memory device corresponding to the hammer address MXADD. In example embodiments, each pair of addresses Ha1 and Ha2 may be the same as pair of addresses Hb1 and Hb2 or different from each other. Thus, the hammer address MXADD may be one or more.

As illustrated in FIG. 15, the third signal generator 150 in the timing controller 100 may activate the hammer refresh signal HREF twice when the hammer priority signal PRT is activated once. The activation time tP2 of the hammer priority signal PRT may be set to be equal to or longer than double the refresh cycle time tRFC required to refresh two rows. The address generator 300 may provide two addresses of two rows that are physically adjacent to a row corresponding to the hammer address through the hammer refresh address signal HRFADD when the hammer priority signal PRT is activated once. For example, the address Ha1 may be smaller by one than the hammer address at time point T2 and the address Ha2 may be larger by one than the hammer address at time point T2. As such, the address Ha1 smaller than the hammer address and the address Ha2 larger than the hammer address may be provided sequentially when the hammer priority signal PRT is activated once. Also, the address Hb1 may be smaller by one than the hammer address or a second hammer address at time point T9 and the address Hb2 may be larger by one than the hammer address or the second hammer address at time point T9. As such, the address Hb1 and the address Hb2 may be provided sequentially when the hammer priority signal PRT is activated once.

Figure 16:
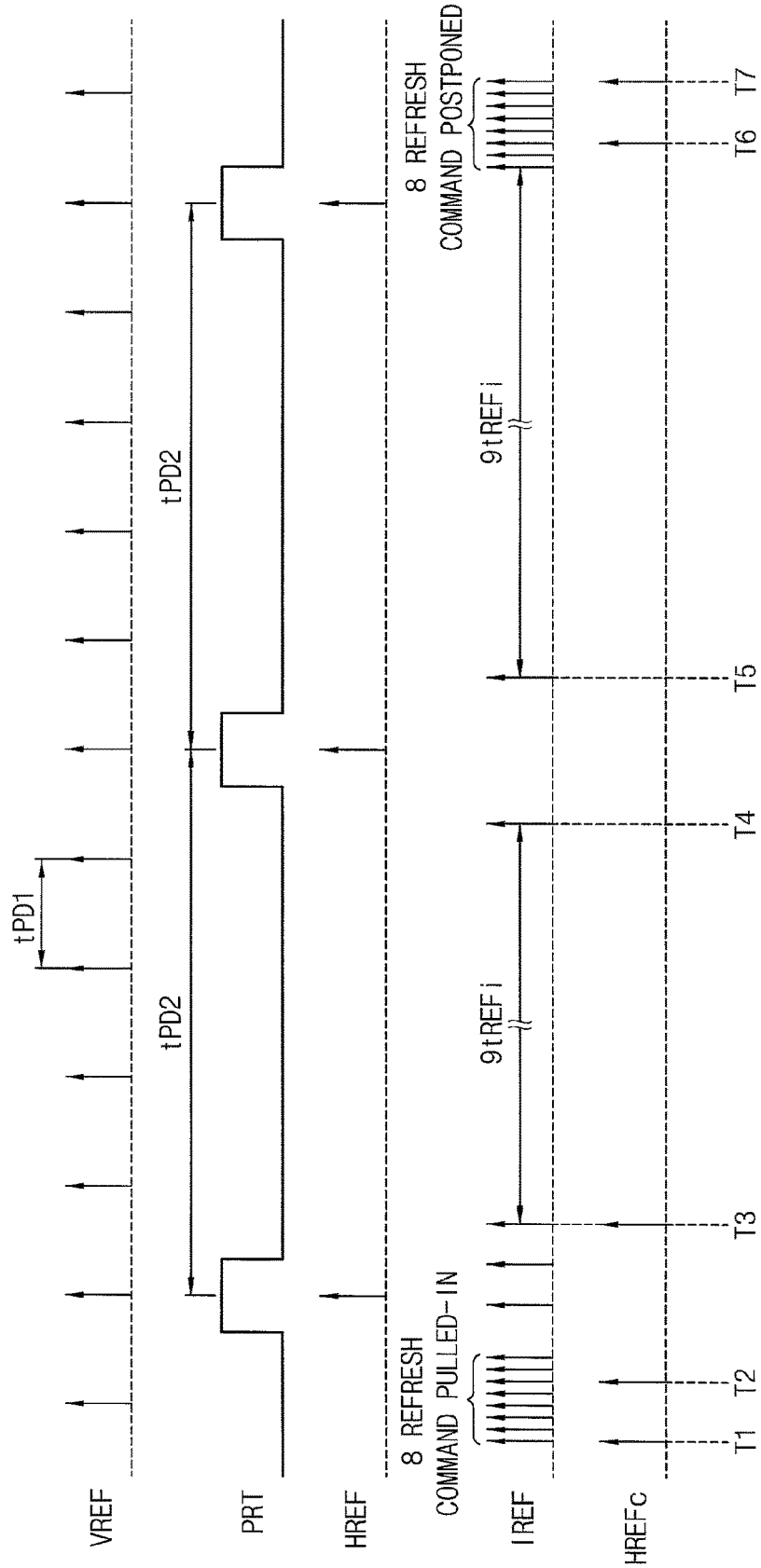
FIG. 16 is a diagram illustrating a periodical hammer refresh operation according to example embodiments.

FIG. 16 is a diagram illustrating a periodical hammer refresh operation according to example embodiments.

FIG. 16 illustrates an example of the internal refresh signal IREF representing the reception timing of the refresh command received from the memory controller. In general, the refresh commands are provided from the memory controller to the memory device regularly according to the average refresh interval time tREFi, but the memory controller may vary the intervals between the refresh commands for enhancement of scheduling and switching of the tasks. For example, as illustrated in FIG. 16, the maximum eight refresh commands may be pulled-in or the maximum eight refresh commands may be postponed according to some DRAM standards. The number of the pulled-in or postponed refresh commands may be determined depending on operational characteristics of the memory device. In this case, the maximum interval between the consecutive two refresh commands is limited to 9*tREFi, and the number of refresh commands that may be issued within 2*tREFi is limited to sixteen.

The hammer refresh signal HREF according to example embodiments and the hammer refresh signal HREFc according to conventional art are illustrated together in FIG. 16. Conventionally the external refresh commands are counted to perform the hammer refresh operation per predetermined number of refresh commands. FIG. 16 illustrates that the conventional hammer refresh signal HREFc is activated at some time points between T1 and T7 corresponding to the reception timing of every fifth refresh command. If the hammer refresh operations are performed by simply counting the number of the refresh commands, the interval between the consecutive hammer refresh operations may be increased significantly by the pulling-in state or the postponing state according to the DRAM standard. For example, the interval between the time points T3 and T6 of the hammer refresh operations may be increased significantly as illustrated in FIG. 16, and the data of the rows adjacent to the row of the hammer address may be lost due to the delay of the hammer refresh operation.

According to example embodiments, the hammer priority signal PRT having the second cyclic period tPD2 may be generated based on the virtual refresh signal VREF having the first cyclic period tPD1, and the hammer refresh signal HREF may be activated periodically using the hammer priority signal PRT. As such, loss of memory cell data may be prevented and performance of the memory device may be enhanced by periodically performing the hammer refresh operation associated with the intensively-accessed hammer address regardless of the refresh command from an external device.

Figure 17:
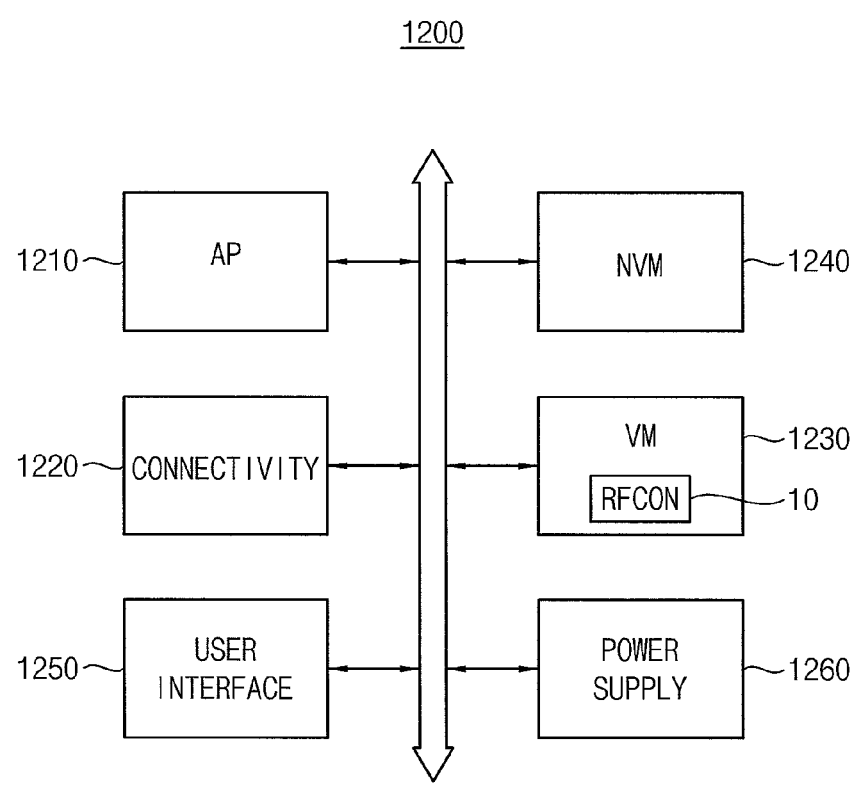
FIG. 17 is a block diagram illustrating a mobile system according to example embodiments.

FIG. 17 is a block diagram illustrating a mobile system according to example embodiments.

Referring to FIG. 17, a mobile system 1200 includes an application processor (AP) 1210, a connectivity unit 1220, a volatile memory device (VM) 1230, a nonvolatile memory device (NVM) 1240, a user interface 1250, and a power supply 1260.

The application processor 1210 may execute applications such as a web browser, a game application, a video player, etc. The connectivity unit 1220 may perform wired or wireless communication with an external device. The volatile memory device 1230 may store data processed by the application processor 1210 or may operate as a working memory. The volatile memory device 1230 may include a refresh controller RFCON 10 according to example embodiments. As described above, the refresh controller RFCON 10 may include a timing controller, a refresh counter and an address generator. Using the refresh controller RFCON 10, loss of memory cell data may be prevented and performance of the memory device may be enhanced by periodically performing the hammer refresh operation associated with the intensively-accessed hammer address regardless of the refresh command from an external device. The nonvolatile memory device 1240 may store a boot image for booting the mobile system 1200. The user interface 1250 may include at least one input device, such as a keypad, a touch screen, etc., and at least one output device, such as a speaker, a display device, etc. The power supply 1260 may supply a power supply voltage to the mobile system 1200.

As such, the refresh controller, the memory device including the refresh controller and the refresh control method according to example embodiments may prevent loss of memory cell data and enhance performance of the memory device by periodically performing the hammer refresh operation associated with the intensively-accessed hammer address regardless of the refresh command from an external device.

The present inventive concept may be applied to any devices and systems including a memory device requiring a refresh operation. For example, the present inventive concept may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The above-disclosed subject matter is to be considered illustrative, and not restrictive, and the appended claims are intended to cover all such modifications, enhancements, and other features, which fall within the true spirit and scope of inventive concepts. Thus, to the maximum extent allowed by law, the scope of inventive concepts is to be determined by the broadest permissible interpretation of the following claims and their equivalents, and shall not be restricted or limited by the foregoing detailed description. While some example embodiments have been particularly shown and described, it will be understood by one of ordinary skill in the art that variations in form and detail may be made therein without departing from the spirit and scope of the claims.

What is claimed is:

1. A refresh controller included in a memory device, the refresh controller comprising:
    a timing controller configured to generate a counter refresh signal in response to receiving a refresh command provided from outside the memory device, and configured to generate a hammer refresh signal that is activated periodically;
    a refresh counter configured to generate a counter refresh address signal in response to the counter refresh signal, the counter refresh address signal representing a row address, the refresh counter being configured to sequentially change the counter refresh address signal; and
    an address generator configured to generate a hammer refresh address signal in response to the hammer refresh signal, the hammer refresh address signal representing an address of a row of the memory device that is physically adjacent to a row of the memory device corresponding to a hammer address that is accessed a number of times greater than a reference number during a predetermined time period,
    wherein the refresh controller is configured to perform a normal refresh operation for the row corresponding to the row address in response to the counter refresh signal,
    wherein the refresh controller is configured to perform a hammer refresh operation for the row that is physically adjacent to the row corresponding to the hammer address in response to the hammer refresh signal, and
    wherein the timing controller includes:
        a first signal generator configured to generate a hammer priority signal activating periodically based on a virtual refresh signal having a first cyclic period;
        a second signal generator configured to generate the counter refresh signal based on the hammer priority signal and the refresh command; and
        a third signal generator configured to generate the hammer refresh signal based on the hammer priority signal.

2. The refresh controller of claim 1, wherein the timing controller is configured to receive a virtual refresh signal having a first cyclic period and to activate the hammer refresh signal by a second cyclic period based on the virtual refresh signal, the second cyclic period being n times the first cyclic period where n is a positive integer.

3. The refresh controller of claim 2, wherein the virtual refresh signal is a refresh clock signal for a self-refresh operation and the first cyclic period corresponds to an average refresh interval time.

4. The refresh controller of claim 1, wherein the timing controller is configured to activate the counter refresh signal in response to the hammer refresh signal not being activated.

5. The refresh controller of claim 1, wherein the timing controller is configured to deactivate the counter refresh signal when an activation timing of the hammer refresh signal overlaps with a reception timing of the refresh command and to activate the counter refresh signal in synchronization with the reception timing of the refresh command while the activation timing of the hammer refresh signal does not overlap with the reception timing of the refresh command.

6. The refresh controller of claim 1, wherein the first signal generator is configured to activate the hammer priority signal for an activation time by a second cyclic period based on the virtual refresh signal, the second cyclic period being n times the first cyclic period where n is a positive integer.

7. The refresh controller of claim 6, wherein the second signal generator is configured to deactivate the counter refresh signal regardless of the refresh command during the activation time of the hammer priority signal and to activate the counter refresh signal in synchronization with the refresh command while the hammer priority signal is deactivated.

8. The refresh controller of claim 1, wherein the third signal generator is configured to activate the hammer refresh signal once for each activation of the hammer priority signal.

9. The refresh controller of claim 8, wherein the address generator is configured to provide one address of one row that is physically adjacent to the row corresponding to the hammer address through the hammer refresh address signal when the hammer priority signal is activated.

10. The refresh controller of claim 1, wherein the third signal generator is configured to activate the hammer refresh signal twice whenever the hammer priority signal is activated.

11. The refresh controller of claim 10, wherein the address generator is configured to provide two addresses of two rows that are physically adjacent to the row corresponding to the hammer address through the hammer refresh address signal whenever the hammer priority signal is activated.

12. A memory device comprising:
    a memory cell array including a plurality of memory cells; and
    a refresh controller configured to control a refresh operation of the memory cells, the refresh controller comprising:

a timing controller configured to generate a counter refresh signal in response to reception timing of a refresh command provided from a memory controller, and to generate a hammer refresh signal in response to a virtual refresh signal, the hammer refresh signal and the virtual refresh signal being activated periodically regardless of the reception timing of the refresh command;

a refresh counter configured to generate a counter refresh address signal in response to the counter refresh signal, the counter refresh address signal representing a row address of the memory device that is changing sequentially; and an address generator configured to generate a hammer refresh address signal in response to the hammer refresh signal, the hammer refresh address signal representing an address of a row of the memory device that is physically adjacent to a row of the memory device corresponding to a hammer address that is accessed a number of times greater than a reference number during a predetermined time period, wherein the timing controller comprises a refresh control signal generator configured to generate a refresh priority signal in response to the virtual refresh signal, the refresh priority signal being activated periodically, and wherein the timing controller is configured to generate the counter refresh signal in response to the reception timing of the refresh command and the refresh priority signal not being activated.

13. The memory device of claim 12, wherein the timing controller is configured to receive the virtual refresh signal having a first cyclic period, and to activate the hammer refresh signal by a second cyclic period based on the virtual refresh signal, the second cyclic period being n times the first cyclic period where n is a positive integer.

14. A memory device comprising:

a memory cell array including a plurality of memory cells arranged in rows and columns; and a refresh control circuit configured to generate a counter refresh signal in response to a refresh command received from outside the memory device, and configured to generate a hammer refresh signal in response to an internal refresh command, the hammer refresh signal and the internal refresh command being activated periodically, wherein the refresh control circuit is configured to perform a first refresh operation for rows of the memory cell array in response to the counter refresh signal, and is configured to, in response to the hammer refresh signal, perform a second refresh operation for a row of the memory cell array that is an adjacent row corresponding to a hammer address accessed a number of times greater than a reference number during a predetermined time period, wherein the refresh control circuit comprises a refresh control signal generator configured to generate a refresh priority signal in response to the internal refresh command, the refresh priority signal being activated periodically, and wherein the refresh control circuit is configured to generate the counter refresh signal in response to the refresh command and the refresh priority signal not being activated.

15. The memory device of claim 14, wherein the internal refresh command is periodically activated by a period of time, and wherein the hammer refresh signal is periodically activated by a period of n times, where n is a positive integer.

16. The memory device of claim 14, wherein the refresh control circuit comprises:

a first refresh address generator configured to generate refresh addresses of the rows in response to the counter refresh signal such that the refresh control circuit performs the first refresh operation, and a second refresh address generator configured to generate a hammer refresh address of the row that is the adjacent row corresponding to the hammer address in response to the hammer refresh signal such that the refresh control circuit performs the second refresh operation.

17. The memory device of claim 14, wherein the refresh control circuit is configured to perform the second refresh operation when the refresh command is received after receiving the hammer refresh signal in response to the refresh priority signal being activated.

* * * * *